(12) United States Patent
Tseng

(10) Patent No.: US 9,031,363 B2
(45) Date of Patent: May 12, 2015

(54) OPTICAL COMMUNICATION DEVICE WITH PHOTOELECTRIC ELEMENT AND DRIVER CHIP

(71) Applicant: Hon Hai Precision Industry Co., Ltd., New Taipei (TW)

(72) Inventor: Kuo-Fong Tseng, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/972,858

(22) Filed: Aug. 21, 2013

(65) Prior Publication Data
US 2014/0177998 A1 Jun. 26, 2014

(30) Foreign Application Priority Data
Dec. 21, 2012 (TW) .............................. 101149088 A

(51) Int. Cl.
*G02B 6/32* (2006.01)
*G02B 6/42* (2006.01)

(52) U.S. Cl.
CPC ............ *G02B 6/4206* (2013.01); *G02B 6/4214* (2013.01); *G02B 6/4279* (2013.01)

(58) Field of Classification Search
CPC ........ G02B 6/4214; G02B 6/42; G02B 6/423; G02B 6/4228; H05K 3/3436
USPC .................................. 385/14, 33, 88; 257/98
See application file for complete search history.

(56) References Cited

U.S. PATENT DOCUMENTS

| 6,343,164 B1 * | 1/2002 | Robertsson et al. ............ 385/14 |
| 6,491,447 B2 * | 12/2002 | Aihara ............. 385/92 |
| 7,298,941 B2 * | 11/2007 | Palen et al. ..................... 385/33 |
| 8,722,449 B2 * | 5/2014 | Wada .............................. 438/65 |
| 2003/0002770 A1 * | 1/2003 | Chakravorty et al. .......... 385/14 |
| 2004/0126064 A1 * | 7/2004 | Vandentop et al. ............. 385/49 |
| 2006/0239605 A1 * | 10/2006 | Palen et al. ..................... 385/14 |
| 2007/0045646 A1 * | 3/2007 | Low et al. ....................... 257/98 |
| 2011/0013866 A1 * | 1/2011 | Rosenberg et al. ............. 385/14 |
| 2012/0225514 A1 * | 9/2012 | Wada .............................. 438/65 |

* cited by examiner

*Primary Examiner* — Peter Radkowski
(74) *Attorney, Agent, or Firm* — Novak Druce Connolly Bove + Quigg LLP

(57) ABSTRACT

An optical communication device includes a substrate, a photoelectric element, a driver chip, a light waveguide unit, and a lens element. The substrate defines a receiving groove and a number of positioning holes around the receiving groove. The photoelectric element and the driver are electrically positioned on the substrate. The photoelectric element is configured for emitting/receiving optical signals, and the driver chip is configured for driving the photoelectric element to emit/receive optical signals. The light waveguide unit is configured for transmitting optical signals. The lens element includes a number of positioning portions corresponding to the positioning holes. The lens element is received in the receiving groove, and the positioning portions are received in the positioning holes.

12 Claims, 1 Drawing Sheet

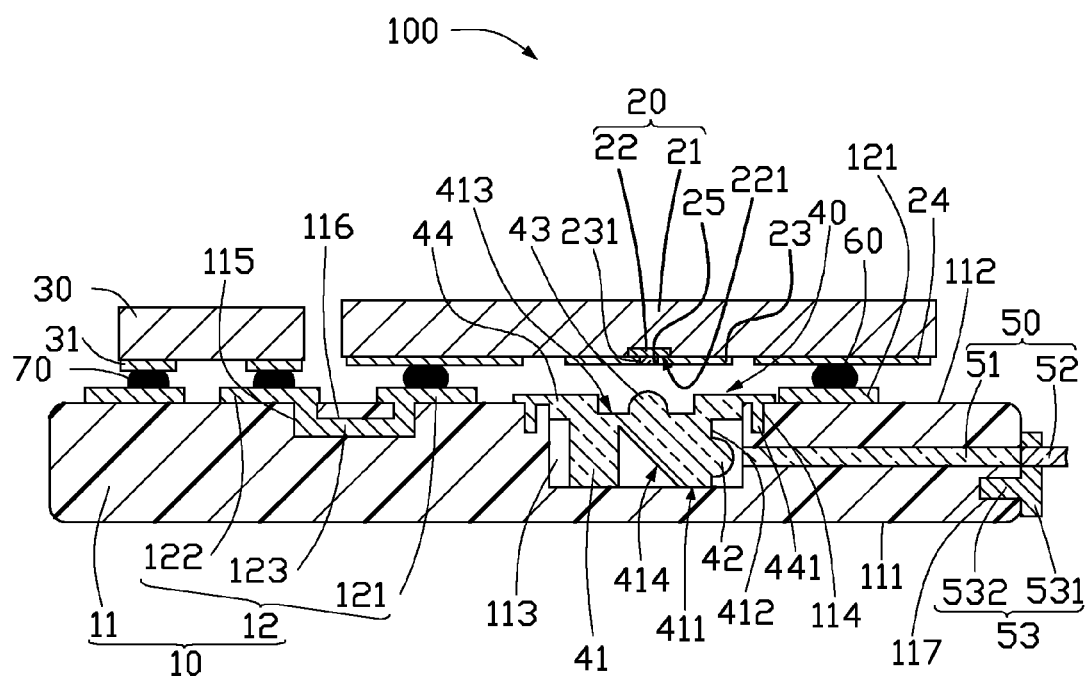

OPTICAL COMMUNICATION DEVICE WITH PHOTOELECTRIC ELEMENT AND DRIVER CHIP

BACKGROUND

1. Technical Field

The present disclosure relates to communication devices, and particularly to an optical communication device.

2. Description of Related Art

An optical communication device includes a photoelectric element for emitting/receiving optical signals, a driver chip for driving the photoelectric element, a light waveguide for transmitting optical signals, and a lens element for optically coupling the photoelectric element with the light waveguide. To ensure an optical transmitting efficiency of the optical communication device, the photoelectric element and the light waveguide need to be accurately aligned with the lens element. However, a complicated alignment mechanism and method is needed to align the photoelectric element and the light waveguide with the lens element, which increases a cost and assembling difficulty of the optical communication device.

Therefore, what is needed is an optical communication device addressing the limitations described.

BRIEF DESCRIPTION OF THE DRAWING

The components of the drawing are not necessarily drawn to scale, the emphasis instead being placed upon clearly illustrating the principles of the embodiments of the present disclosure.

The FIGURE is a schematic view of an optical communication device, according to an exemplary embodiment of the present disclosure.

DETAILED DESCRIPTION

The FIGURE shows an optical communication device 100, according to an exemplary embodiment. The optical communication device 100 includes a substrate 10, a photoelectric element 20, a driver chip 30, a lens element 40, and a light waveguide unit 50.

The substrate 10 includes a base layer 11 and a conductive circuit 12 formed on the base layer 11. The base layer 11 includes a first surface 111 and an opposite second surface 112. In this embodiment, a material of the base layer 11 is silicon. The base layer 11 defines a receiving groove 113 and a number of positioning holes 114 around the receiving groove 113. The receiving groove 113 and the positioning holes 114 are defined in the second surface 112. The base layer 11 defines two blind holes 115 and a connecting hole 116 communicating with the blind holes 115. The conductive circuit 12 is configured for electrically connecting the photoelectric element 20 to the driver chip 30. In detail, the conductive circuit 12 includes a number of first electrical contacts 121 corresponding to the photoelectric element 20, a number of second electrical contacts 122 corresponding to the driver chip 30, and a connecting portion 123. The first electrical contacts 121 and the second electrical contacts 122 are formed on the second surface 112. The first electrical contacts 121 are positioned at two opposite sides of the receiving groove 113. The connecting portion 123 is received in the blind holes 115 and the connecting hole 116. Two opposite ends of the connecting portion 123 are respectively electrically connected to a corresponding first electrical contact 121 and a corresponding second electrical contact 122.

The photoelectric element 20 is configured for emitting/receiving optical signals. The photoelectric element 20 may be a laser diode, a photodiode, or a combination of a laser diode and a photodiode. In this embodiment, the photoelectric element 20 includes a laser diode and a photodiode. The photoelectric element 20 includes a base portion 21 and an optical portion 22 formed on the base portion 21. The photoelectric element 20 emits/receives optical signals via the optical portion 22. The optical portion 22 includes an optical surface 221, which serves as an emergent/incident surface of optical signals. The optical surface 221 faces toward the substrate 10. The photoelectric element 20 includes a light shielding sheet 23 covering the optical portion 22. The light shielding sheet 23 is made of an opaque material. In this embodiment, the light shielding sheet 23 is made of metal. The light shielding sheet 23 defines an aperture 231. The aperture 231 exposes a predetermined area of the optical surface 221 out of the light shielding sheet 23. Thus, the aperture 231 forms an optical signal transmitting channel of the photoelectric element 20. The photoelectric element 20 further includes a transparent film 25 in the aperture 231 for protecting the optical surface 221 from being damaged. The photoelectric element 20 includes a number of first conductive pins 24 corresponding to the first electrical contacts 121. The first conductive pins 24 are formed on a surface of the base portion 21. The photoelectric element 20 is mechanically and electrically connected to the substrate 10 via a flip chip. In detail, the first conductive pins 24 are electrically connected to the corresponding first electrical contacts 121 by a number of corresponding first soldering balls 60.

The driver chip 30 is configured for driving the photoelectric element 20 to emit/receive optical signals. The driver chip 30 includes a number of second conductive pins 31 corresponding to the second electrical contacts 122. The driver chip 30 is mechanically and electrically connected to the substrate 10 with a surface having the second conductive pins 31 facing toward the substrate 10. In this embodiment, the driver chip 30 is connected to the substrate 10 via a flip chip. In detail, the second conductive pins 31 are electrically connected to the corresponding second electrical contacts 122 by a number of corresponding second soldering balls 70. The driver chip 30 and the photoelectric element 20 are electrically connected to each other by the conductive circuit 12.

The lens element 40 is received in the receiving groove 113 and is configured for optically coupling the photoelectric element 20 to the light waveguide unit 50. The lens element 40 includes a main portion 41, a first converging portion 42, a second converging portion 43 corresponding to the first converging portion 42, and a number of positioning portions 44 corresponding to the positioning holes 114. The main portion 41 includes a bottom surface 411, a first interface 412, a second interface 413, and a deflecting surface 414. In this embodiment, the first interface 412 is substantially perpendicular to the bottom surface 411, and the second interface 413 is substantially perpendicular to the first interface 412. Angles formed between the deflecting surface 414 and the first and second interfaces 412, 413 are both substantially 45 degrees. The first converging portion 42 is formed on the first interface 412 and is aligned with the light waveguide unit 50. The second converging portion 43 is formed on the second interface 413 and is aligned with the aperture 231 of the photoelectric element 20. In this embodiment, the first converging portion 42 and the second converging portion 43 are convex lenses.

The positioning portions 44 are formed on two opposite sides of the main portion 41. Each positioning portion 44 extends to a corresponding positioning hole 114. Each positioning portion 44 includes a positioning pole 441, and the positioning pole 441 inserts into the corresponding positioning hole 114. By engagement of the positioning pole 441 and the positioning hole 114, the first converging portion 42 and the second converging portion 43 are easily and accurately aligned with the light waveguide unit 50 and the photoelectric element 20.

The light waveguide unit 50 is configured for transmitting optical signals. The light waveguide unit 50 includes a planar light waveguide 51 and a flexible light waveguide 52. The planar light waveguide 51 is embedded in the substrate 10. One end of the planar light waveguide 51 extends through an inner side surface of the receiving groove 113 and is optically aligned with the first converging portion 42 of the lens element 40, while the other end of the planar light waveguide 51 extends through a side surface of the substrate 10 and is coupled with the flexible light waveguide 52. The flexible light waveguide 52 is connected to the side surface of the substrate 10 by a connecting member 53. The connecting member 53 includes a fixing portion 531 and an inserting portion 532 connected to the fixing portion 531. The fixing portion 531 holds an end of the flexible light waveguide 52 and fixes an end of the flexible light waveguide 52 to the substrate 10. The substrate 10 defines an inserting hole 117 corresponding to the inserting portion 532 of the connecting member 53, and the inserting portion 532 inserts into the inserting hole 117 to align the flexible light waveguide 52 with the planar light waveguide 51.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being exemplary embodiments of the disclosure.

What is claimed is:

1. An optical communication device, comprising:
   a substrate defining a receiving groove and a plurality of positioning hole around the receiving groove;
   a photoelectric element electrically positioned on the substrate, the photoelectric element comprising a base portion and an optical portion formed on the base portion, the optical portion comprising an optical surface facing toward the substrate, the photoelectric element comprising an opaque light shielding sheet attached on the optical portion and covering the optical portion, the light shielding sheet defining an aperture, and the aperture exposing a predetermined area of the optical surface out of the light shielding sheet;
   a driver chip electrically connected to the substrate, for driving the photoelectric element;
   a light waveguide unit for transmitting optical signals; and
   a lens element for optically coupling the photoelectric element with the light wave guide unit, the lens element comprising a plurality of positioning portions corresponding to the positioning holes, the positioning portions respectively engaged with the positioning holes, and the lens element being optically aligned with the photoelectric element and the light waveguide unit by an engagement of the positioning holes and the positioning portions.

2. The optical communication device of claim 1, wherein the substrate comprises a base layer and a conductive circuit formed on the base layer, the driver chip and the photoelectric element are electrically connected to each other by the conductive circuit.

3. The optical communication device of claim 2, wherein the conductive circuit comprises a plurality of first electrical contacts, a plurality of second electrical contacts corresponding to the driver chip, and a connecting portion connecting one of the first electrical contacts to a corresponding one of the second electrical contacts, the photoelectric element is electrically connected to the first electrical contacts, and the driver chip is electrically connected to the second electrical contacts.

4. The optical communication device of claim 3, wherein the photoelectric element comprises a plurality of first conductive pins corresponding to the first electrical contacts, the photoelectric element is mechanically and electrically connected to the substrate by a manner of flip chip.

5. The optical communication device of claim 4, wherein each first conductive pin is connected to a corresponding one of the first electrical contacts by a first soldering ball.

6. The optical communication device of claim 3, wherein the base layer comprises a first surface and a second surface opposite to the first surface, the receiving groove and the positioning holes is defined in the second surface.

7. The optical communication device of claim 6, wherein the base layer defines two blind holes and a connecting hole communicating with the blind holes, the connecting portions are received in the blind holes and the connecting hole.

8. The optical communication device of claim 1, wherein the lens element comprises a main portion, a first converging portion, and a second converging portion corresponding to the first converging portion, the main portion comprises a first interface, a second interface, and a deflecting surface, the first converging portion is formed on the first interface and is aligned with the light waveguide unit, and the second converging portion is formed on the second interface and is aligned with the photoelectric element.

9. The optical communication device of claim 8, wherein the positioning portions are formed on two opposite sides of the main portion, each positioning portion extends to the corresponding positioning hole, each positioning portion comprises a positioning pole, and the positioning pole inserts into the corresponding positioning hole.

10. The optical communication device of claim 8, wherein the light waveguide unit comprises a planar light waveguide and a flexible light waveguide, the planar light waveguide is embedded in the substrate, one end of the planar light waveguide extends through an inner side surface of the receiving groove and is optically aligned with the first converging portion of the lens element, and the other end of the planar light waveguide extends through a side surface of the substrate and is optically aligned with the flexible light waveguide.

11. The optical communication device of claim 10, wherein the light waveguide unit comprises a connecting member for holding the flexible light waveguide and fixing the flexible light waveguide on the substrate.

12. The optical communication device of claim 11, wherein the connecting member comprises a fixing portion and a inserting portion connected to the fixing portion, the fixing portion holds an end of the flexible light waveguide, the substrate defines an inserting hole corresponding to the inserting portion of the connecting member, and the inserting portion inserts into the inserting hole to align the flexible light waveguide with the planar light waveguide.

* * * * *